US012771366B2

(12) United States Patent
Singh et al.

(10) Patent No.: US 12,771,366 B2
(45) Date of Patent: Oct. 20, 2026

(54) CONTINUOUS-TIME PIPELINE ADC AND METHOD FOR CALIBRATING A DIGITAL FILTER OF A CONTINUOUS-TIME PIPELINE ADC

(71) Applicant: NXP B.V., Eindhoven (NL)

(72) Inventors: Kamlesh Singh, Noida (IN); Sushil Kumar Gupta, Bangalore (IN); Ashish Ashok Panpalia, Bangalore (IN); Pankaj Agrawal, Bangalore (IN)

(73) Assignee: NXP B.V., Eindhoven (NL)

( * ) Notice: Subject to any disclaimer, the term of this patent is extended or adjusted under 35 U.S.C. 154(b) by 125 days.

(21) Appl. No.: 18/970,141

(22) Filed: Dec. 5, 2024

(65) Prior Publication Data

US 2025/0192792 A1 Jun. 12, 2025

(30) Foreign Application Priority Data

Dec. 6, 2023 (IN) ............................ 202341083007

(51) Int. Cl.
*H03M 1/10* (2006.01)
*H03M 1/06* (2006.01)
(Continued)

(52) U.S. Cl.
CPC ....... *H03M 1/1033* (2013.01); *H03M 1/0626* (2013.01); *H03M 1/1009* (2013.01); *H03M 1/164* (2013.01); *H03M 1/502* (2013.01)

(58) Field of Classification Search
CPC .. H03M 1/1033; H03M 1/0626; H03M 1/502; H03M 1/164; H03M 1/50; H03M 1/1009
(Continued)

(56) References Cited

U.S. PATENT DOCUMENTS 10,432,210 B1 10/2019 Yendluri et al.
10,651,870 B2 * 5/2020 Srinivasan ............ H03K 5/159
(Continued)

FOREIGN PATENT DOCUMENTS

CN 114928349 A 8/2022

OTHER PUBLICATIONS

Dong Liran et al.: "A 2-GS/s 200-MHz BW Oversampling Continuous-Time Pipeline ADC with Adaptive Digital Filter in 28nm", 2021 IEEE International Conference on Integrated Circuits, Technologies and Applications (ICTA), IEEE, Nov. 24, 2021, pp. 245-246.
(Continued)

*Primary Examiner* — Khai M Nguyen

(57) ABSTRACT

A continuous-time analog-to-digital converter circuit includes an input configured to receive an analog input signal; a delay element with a specified time delay, the delay element functionally connected between the input and a first summation node; a ADC-DAC path with a sub ADC and a sub DAC connected between the input and the first summation node. The ADC-DAC path is configured to digitize the analog input signal and to reconvert the digitized signal to analog domain and to subtract it at the first summation node. An output of the first summation node is filtered by means of a continuous-time filter and an output of the continuous-time filter is clocked by a specified sampling rate. A backend ADC is configured to digitize the clocked output of the analog filter and to connect the clocked output to a second summation node. An output is obtained by a summation of the output of the backend ADC and an output of a digital filter is connected to the sub ADC. The digital filter is configured to represent a replica of a transfer function of the sampled output of the continuous-time filter in the digital domain.

17 Claims, 14 Drawing Sheets

(51) Int. Cl.
*H03M 1/16* (2006.01)
*H03M 1/50* (2006.01)

(58) Field of Classification Search
USPC .......................................... 341/120, 143, 161
See application file for complete search history.

(56) References Cited

U.S. PATENT DOCUMENTS

| | | | | |
|---|---|---|---|---|
| 11,218,158 | B1 | 1/2022 | Patil et al. | |
| 11,563,442 | B2 | 1/2023 | Kozlov et al. | |
| 11,652,491 | B2 * | 5/2023 | Kozlov | H03M 1/0626<br>341/110 |

OTHER PUBLICATIONS

H. Shibata et al., "A 9 GS/s 1.125 GHz BW oversampling continuous time pipeline ADC achieving -164 dBFS/Hz NSD," IEEE J. Solid-State Circuits, vol. 52, No. 12, pp. 3219-3234, Dec. 2017.
N. Basavaraj et al.: "Simplified simulation and measurement of the signal transfer function of a continuous-time pipelined analog-to-digital converter," IEEE rans. Circuits Syst. II, Exp. Briefs, vol. 69, No. 10, pp. 3993-3997, Oct. 2022.
S. Manivannan et al.: "A 65-nm CMOS continuous-time pipeline ADC achieving 70-dB SNDR in 100-MHz bandwidth," IEEE Solid-State Circuits Lett., vol. 4, pp. 92-95, Oct. 2021.
S. Pavan et al.: "Analysis and Design of Wideband Filtering ADCs Using Continuous-Time Pipelining," in IEEE Journal of Solid-State Circuits, vol. 59, No. 1, pp. 268-281, Jan. 2024.

* cited by examiner a)

b)

Harmonic Distortion

| Zero-Order... | THD | SNR | SINAD | SFDR | H |
|---|---|---|---|---|---|
| Rel Power (dBc) | -6.7052e+1 | 3.8402e+1 | 3.8396e+1 | 48331e+1 | 0 |

c)

a)

b)

c)

CONTINUOUS-TIME PIPELINE ADC AND METHOD FOR CALIBRATING A DIGITAL FILTER OF A CONTINUOUS-TIME PIPELINE ADC

CROSS-REFERENCE TO RELATED APPLICATIONS

This application claims priority under 35 U.S.C. § 119 to Indian patent application no. 202341083007, filed 6 Dec. 2023, the contents of which are incorporated by reference herein.

TECHNICAL FIELD

The present disclosure relates to continuous-time pipeline ADC. Furthermore, the present disclosure relates to a method of calibrating a digital filter of a continuous-time pipeline ADC.

BACKGROUND

In a continuous-time pipeline (CTP) ADC, the digital outputs of various stages are combined to give the final ADC output signal. This reconstruction requires estimating digital filters for various stages. This digital reconstruction needs to match a sampled analog system. The digital filter needs to match an analog path, wherein mismatch degrades the overall performance of the CTP ADC.

SUMMARY

According to a first aspect, a continuous-time analog-to-digital converter circuit includes:

- an input configured to receive an analog input signal;
- a delay element with a specified time delay, the delay element functionally connected between the input and a first summation node;
- a ADC-DAC path with a sub ADC and a sub DAC connected between the input and the first summation node, the ADC-DAC path configured to digitize the analog input signal and to reconvert the digitized signal to analog domain and to subtract it at the first summation node;
- wherein an output of the first summation node is filtered by means of a continuous-time filter, wherein an output of the continuous-time filter is clocked by a specified sampling rate;
- wherein a backend ADC is configured to digitize the clocked output of the analog filter and to connect the clocked output to a second summation node;
- wherein an output is obtained by a summation of the output of the backend ADC and an output of a digital filter being connected to the sub ADC, characterized in that the digital filter is configured to represent a replica of a transfer function of the sampled output of the continuous-time filter in the digital domain.

It is assumed, that a delay of an ADC-DAC path is already tuned/programmed by any other method, wherein the digital filter of the proposed CTP ADC circuit only matches the analog path. This advantageously allows to increase a gain of the analog filter block, resulting in an improved performance of the CTP ADC circuit.

According to a further aspect, a method for calibrating a digital filter of a continuous-time analog-to-digital converter circuit, includes:

- setting the continuous-time analog-to-digital converter circuit into a calibration mode;
- applying a calibration input signal at an input;
- delaying the calibration input signal by means of a delay element with a specified time delay, the delay element functionally connected between the input and a first summation node;
- digitizing the calibration input signal and reconverting the digitized signal to analog domain and to subtract it at the first summation node;
- filtering an output of the first summation node by means of a continuous-time filter and clocking the output of the continuous-time filter with a specified sampling rate;
- digitizing the clocked output of the continuous-time filter by means of a backend ADC and applying it to a second summation node;
- providing an output signal of the continuous-time analog-to-digital converter circuit by summing up the output of the backend ADC with an output of a digital filter being connected to a sub ADC being connected to the input; and
- providing a replica of a transfer function of the sampled output of the continuous-time filter in the digital domain by means of the digital filter.

In one or more embodiments, filter coefficients of said digital filter are provided by a calibration device.

In one or more embodiments, the CTP ADC circuit further comprises a signal source being configured to feed its signal to the calibration device, wherein the output is applied to the calibration device, wherein the calibration device is configured to update the filter coefficients of the digital filter.

According to one or more embodiments, the signal source is configured to generate one of the following: pseudo random signal, sine wave signal. Advantageously, even more alternative kinds of signal sources are possible to be used.

According to one or more embodiments, the digital filter is one of the following: adaptive IIR-filter, adaptive FIR filter.

According to one or more embodiments, the CTP ADC circuit comprises switches which are configured to set the ATP ADC circuit into a calibration mode and into normal operation mode.

According to one or more embodiments, the CTP ADC circuit further comprises a gain stage between the sub ADC and the digital filter and/or a gain stage between the first summation node and the continuous-time filter, wherein at least one of said gain stages is bypassed in the calibration mode.

According to one or more embodiments, a calibration algorithm running on the calibration device is a normalized LMS algorithm. The normalized LMS provides a fast way of implementing the calibration procedure of the digital filter.

According to one or more embodiments, a number of calibration cycles of the calibration algorithm is known in advance, wherein after having performed the calibration the filter coefficients have converged within a specified tolerance. The number of cycles can be determined in advance, e.g. by means of a simulation process (e.g. MATLAB).

According to one or more embodiments, the signal source and the calibration device are on-chip or off-chip. An on-chip signal source is easy to implement. Furthermore, also the calibration device is preferably implemented on-chip in order to perform calibration when temperature varies.

According to one or more embodiments, the CTP ADC circuit further comprises a DC blocker functionally coupled between an output of the second summation node and the calibration device. In this way, DC components can be filtered from digital error data, i.e. an offset may be removed or at least reduced.

According to one or more embodiments, the CTP ADC circuit is one of the following: IIR-filter, CIC-filter, FIR-filter.

According to one or more embodiments, a value of the sampling rate of the output of the continuous-time filter is equal or smaller than a value of the sampling rate of the sub DACs.

BRIEF DESCRIPTION OF DRAWINGS

The above discussion/summary is not intended to describe each embodiment or every implementation of the present disclosure. The drawings and detailed description that follow also exemplify various embodiments. The aspects defined above and further aspects of the present disclosure are apparent from the examples of embodiment to be described hereinafter with reference to the appended drawings, which are explained with reference to the examples of embodiment. However, needless to say, that the disclosure is not limited to the examples of embodiments.

All illustrations in the drawings are schematical. It is noted that in different figures, similar or identical elements or features are provided with the same reference signs or with reference signs that are different from the corresponding reference signs only within the first digit. In order to avoid unnecessary repetitions, elements or features which have already been elucidated with respect to a previously described embodiment are not elucidated again at a later position of the description.

Figure 1:
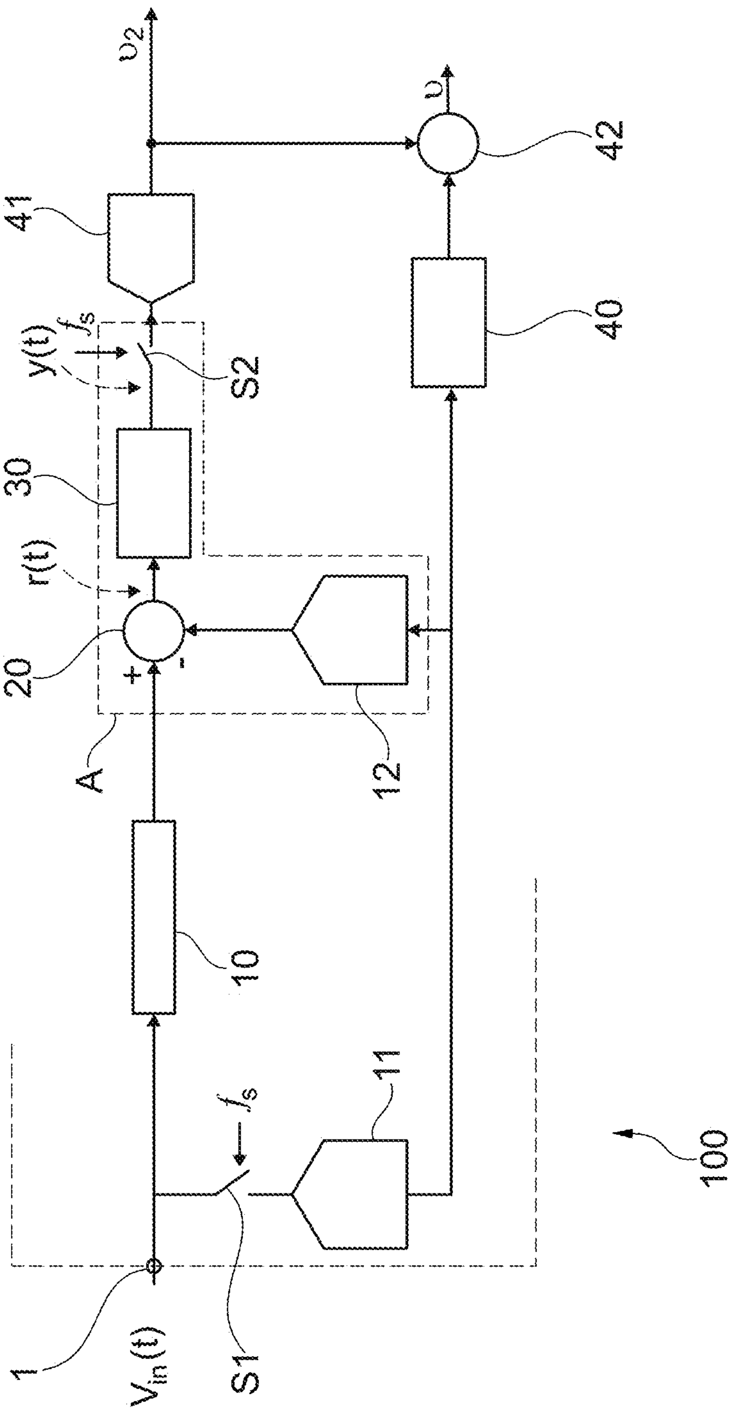
Fig. 1 Prior art
Figure 2:
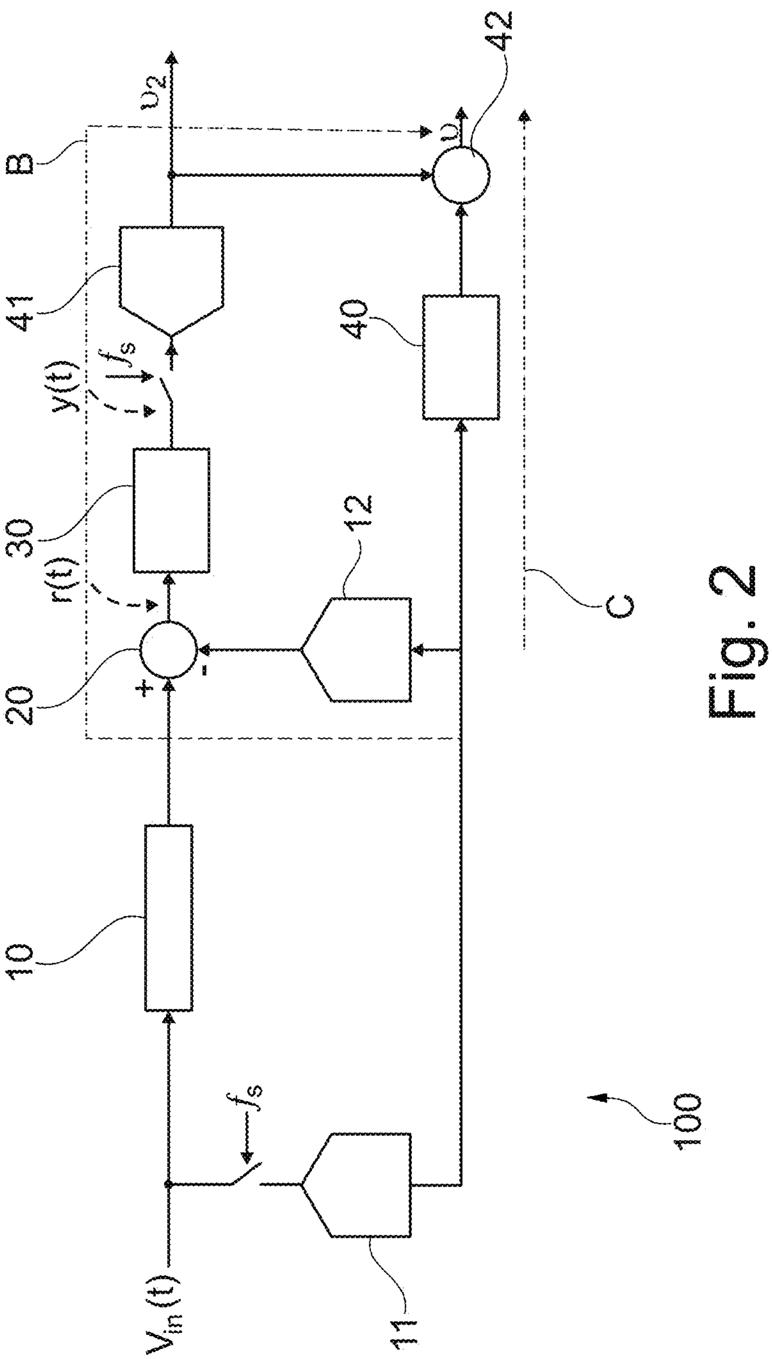
Figure 3:
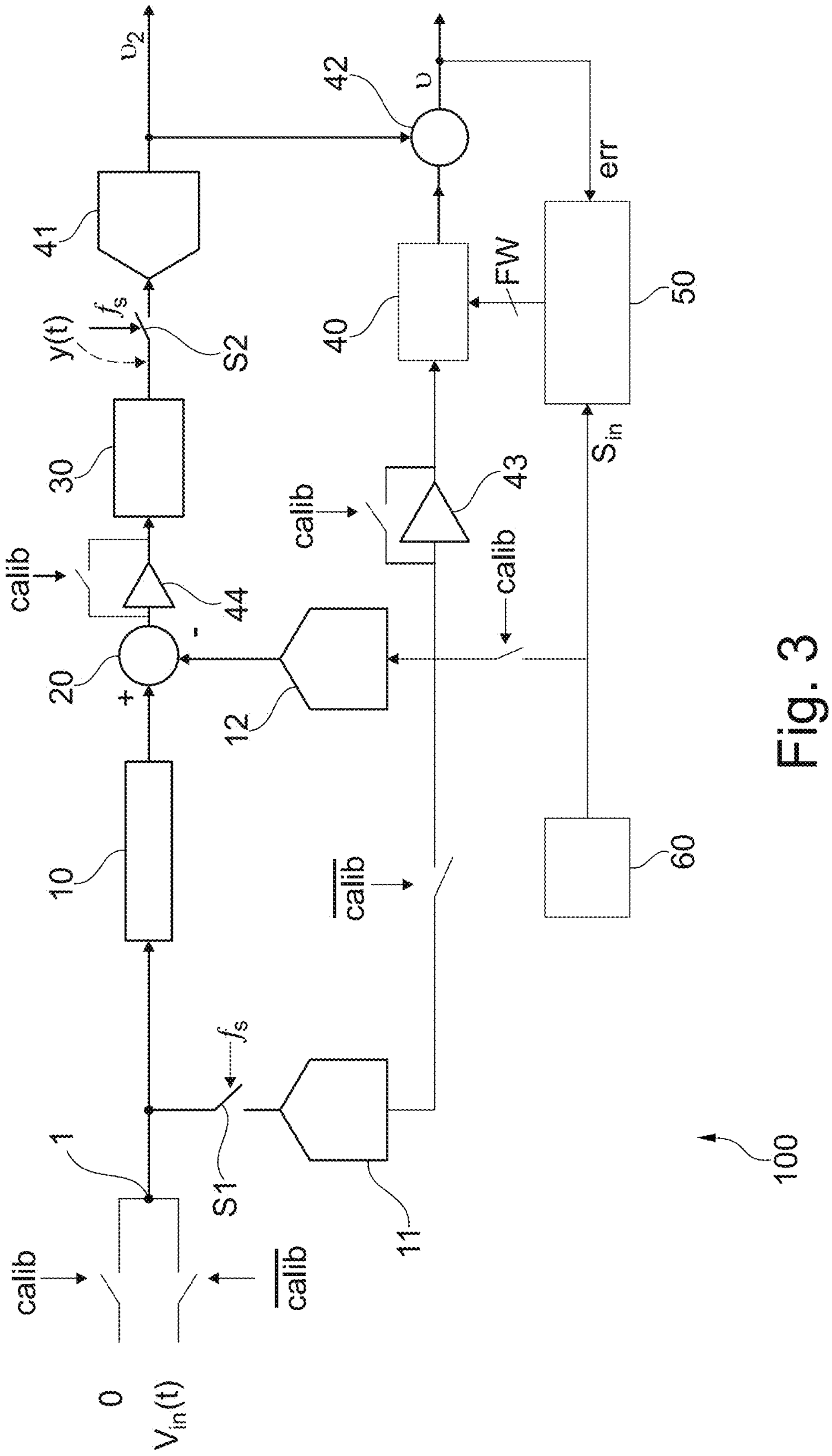
Figure 4:
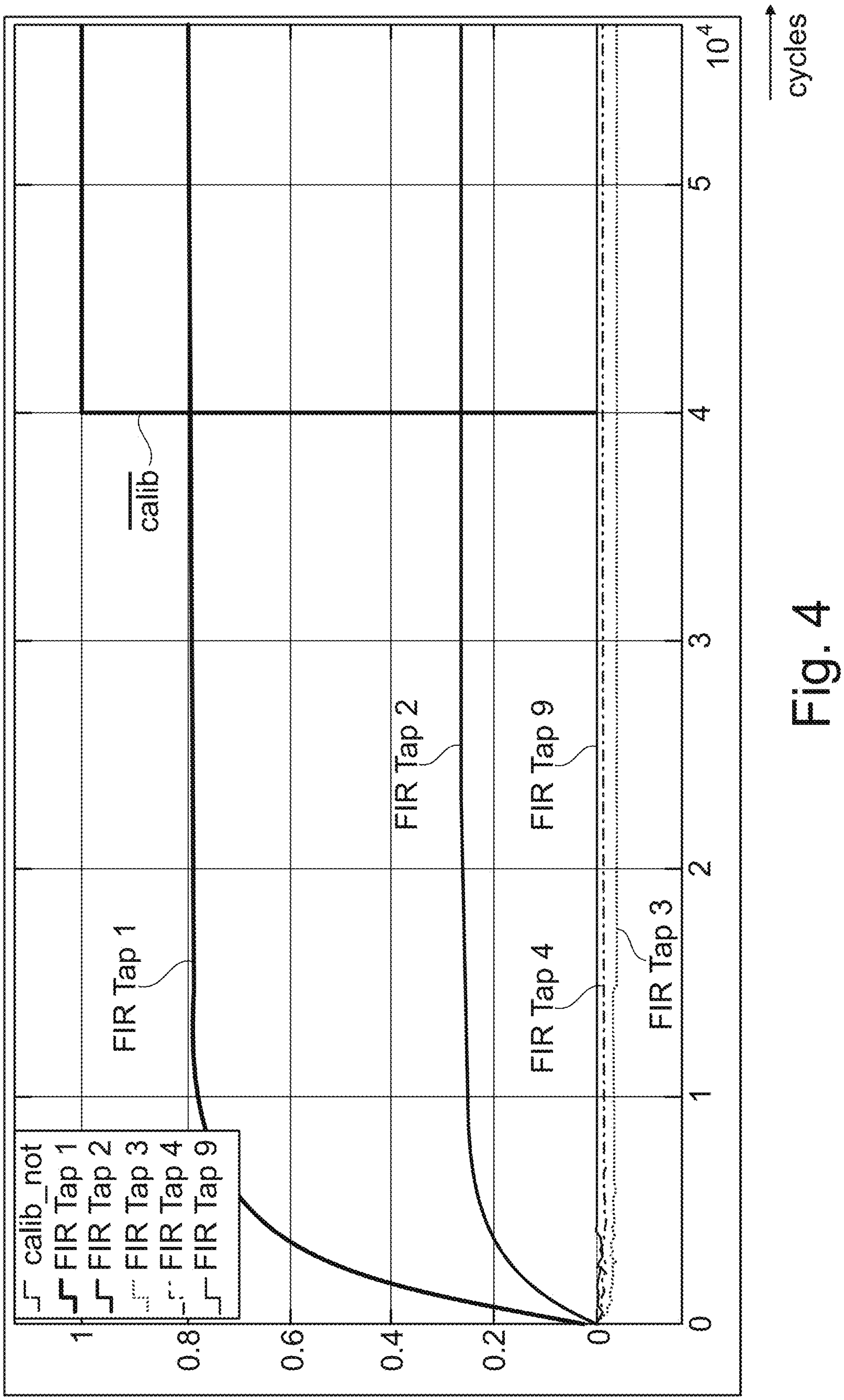
Figure 5:
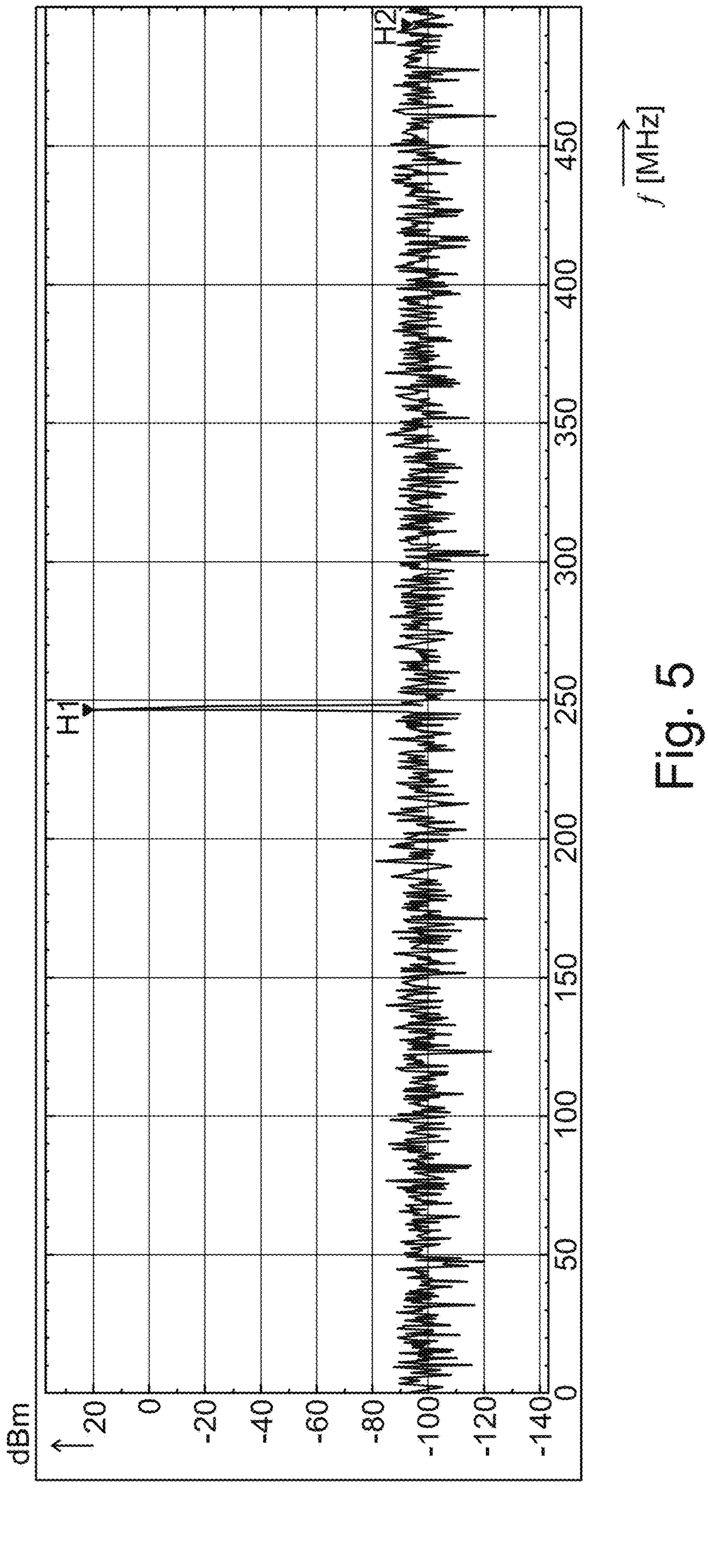
Figure 6:
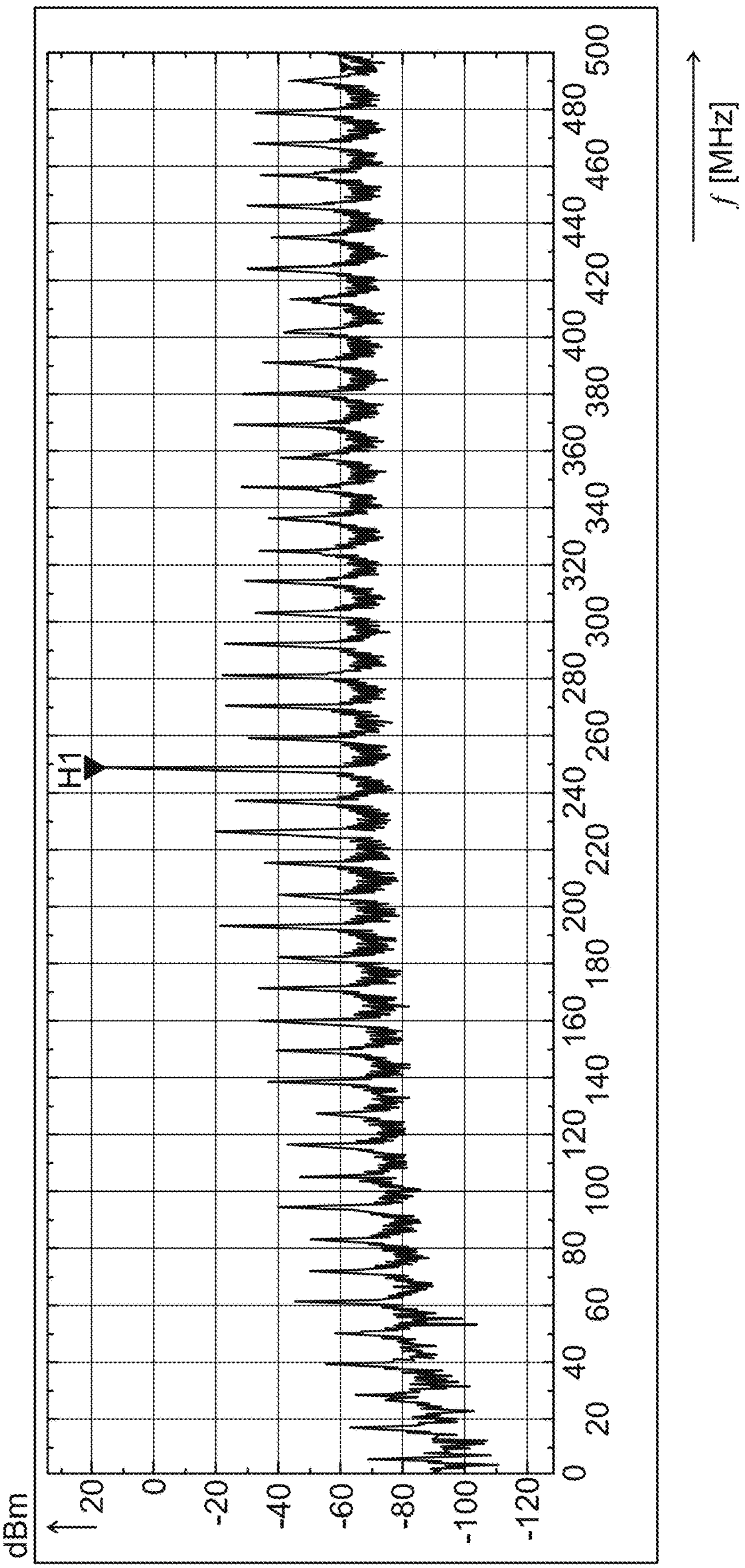
Figure 7:
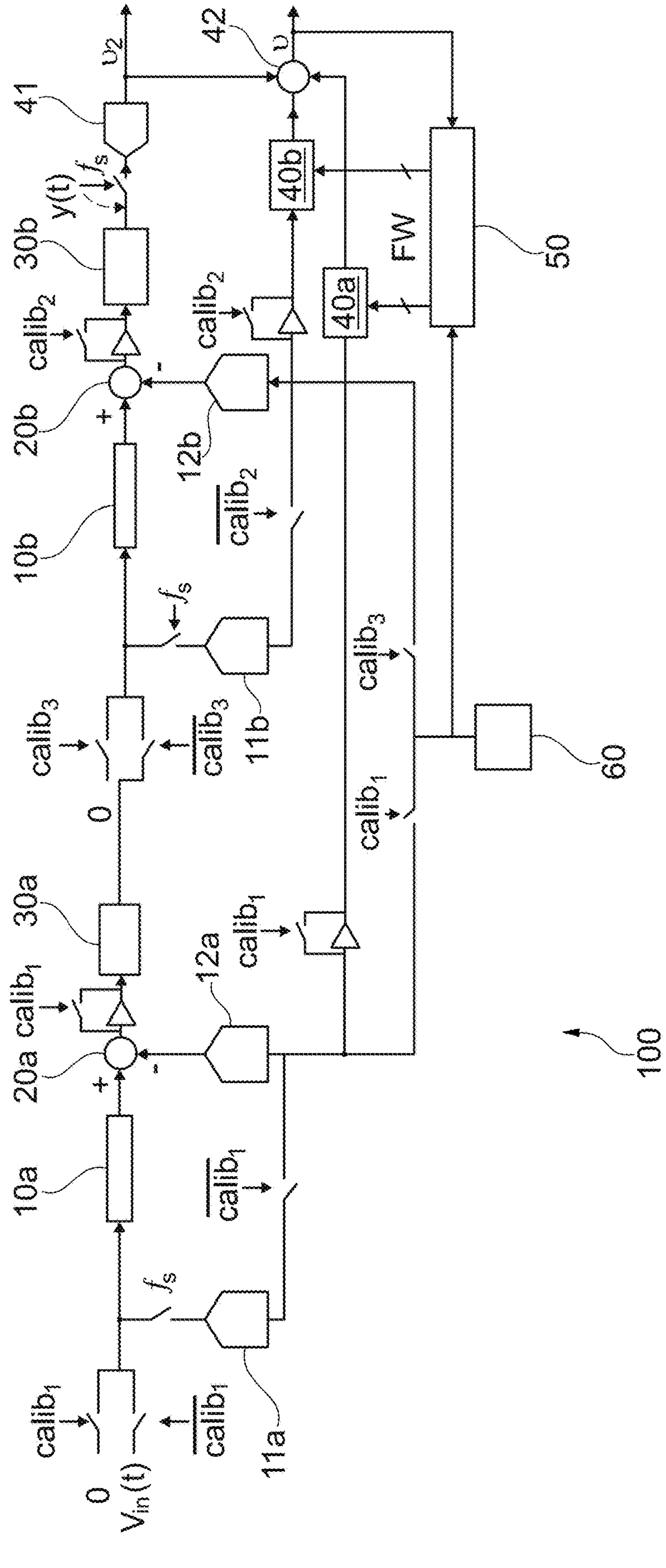
Figure 8:
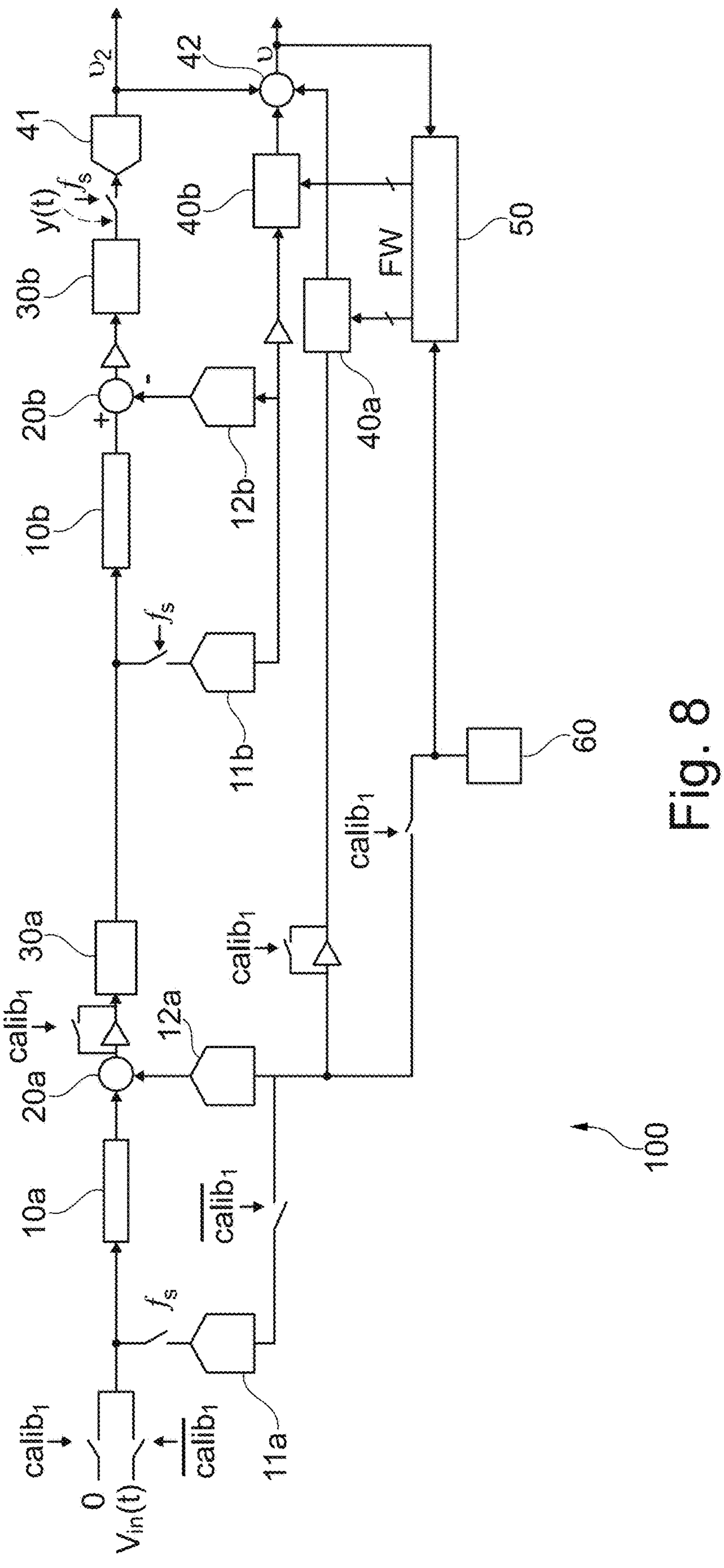
Figure 9:
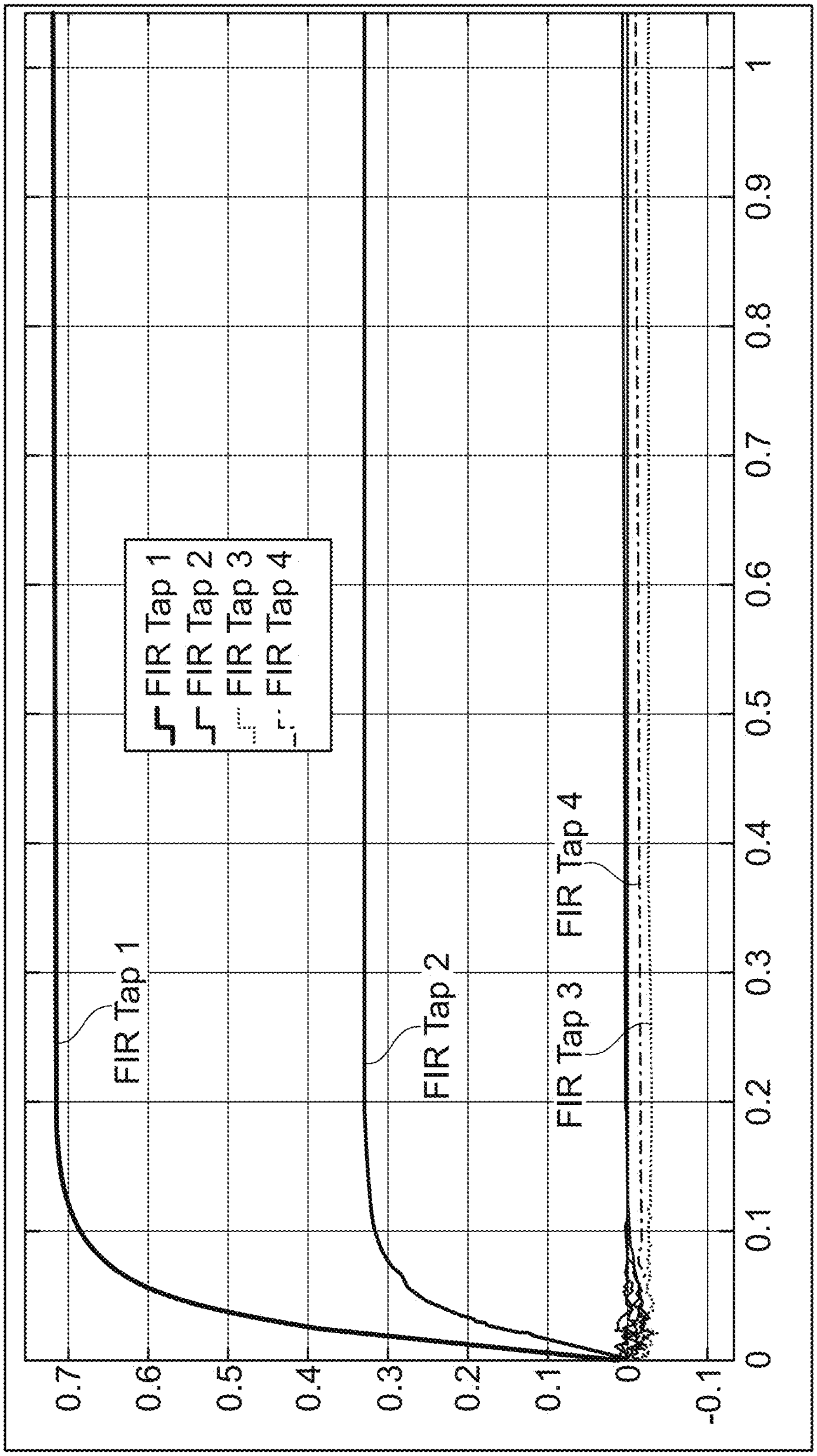
Figure 10:
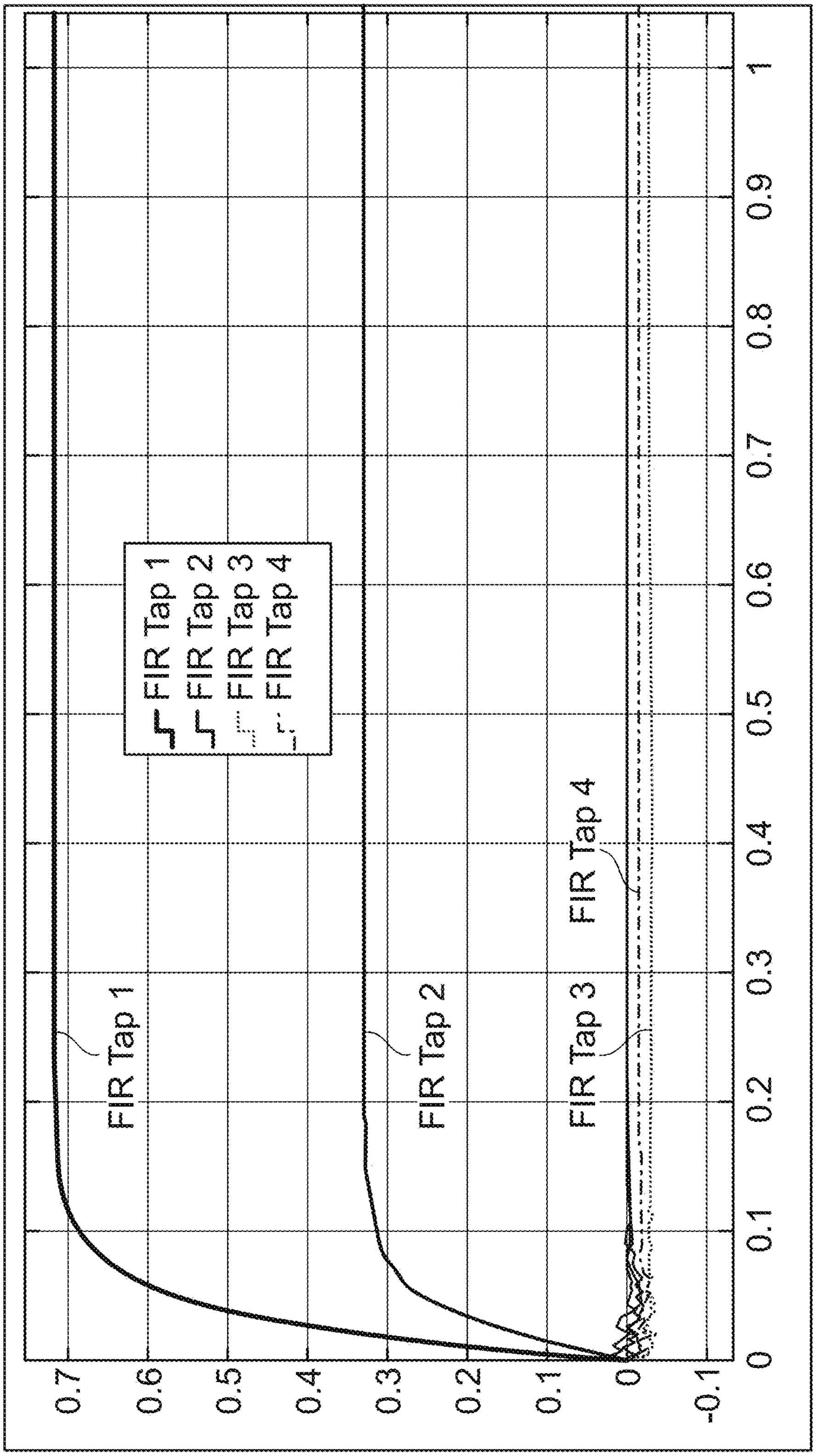
Figure 11:
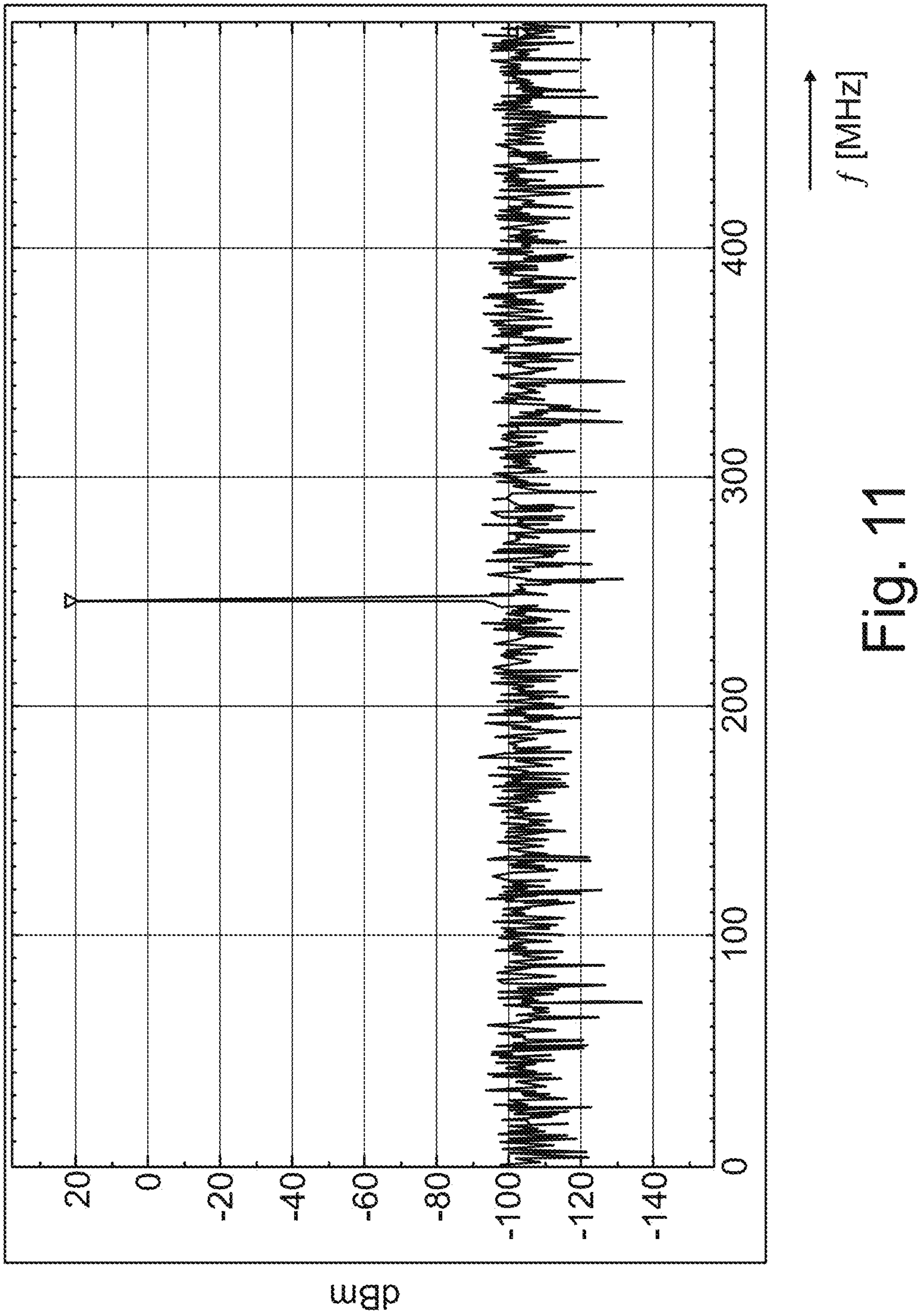
Figure 12:
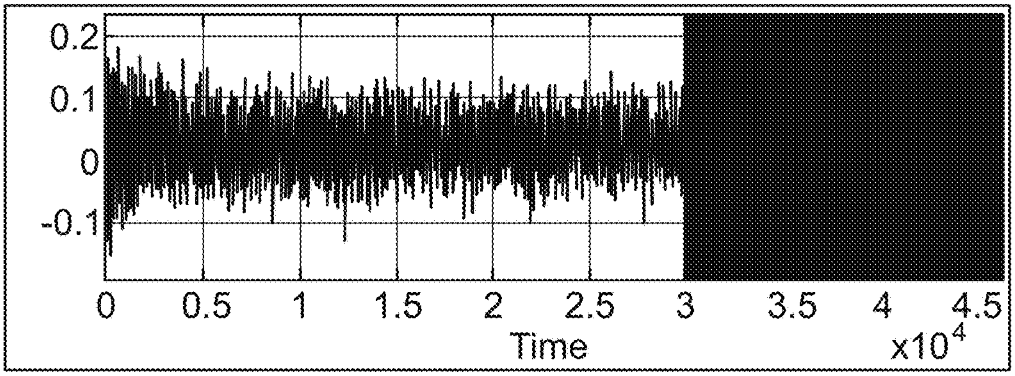
Figure 12:
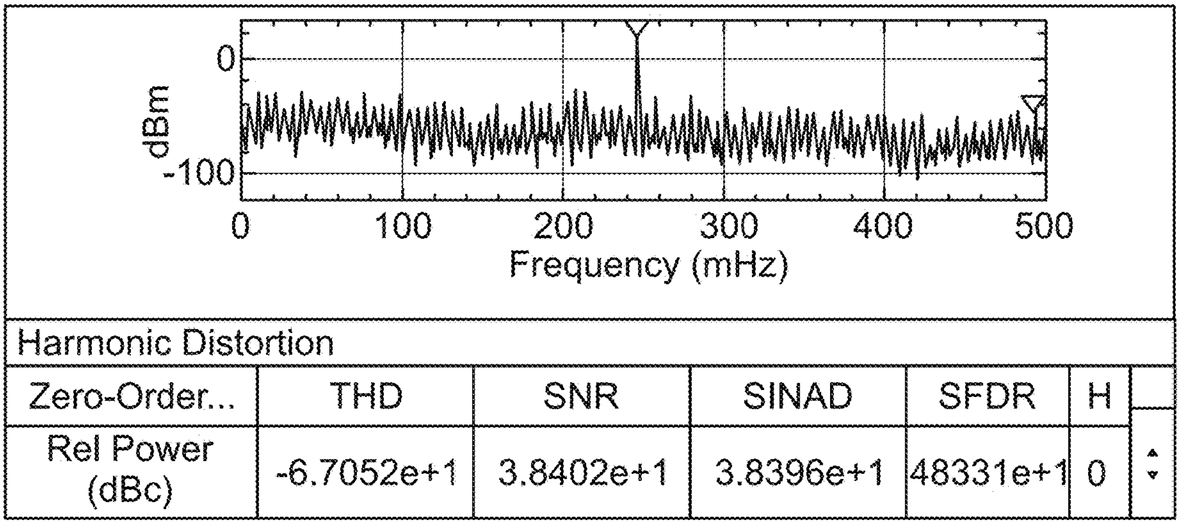
Figure 12:
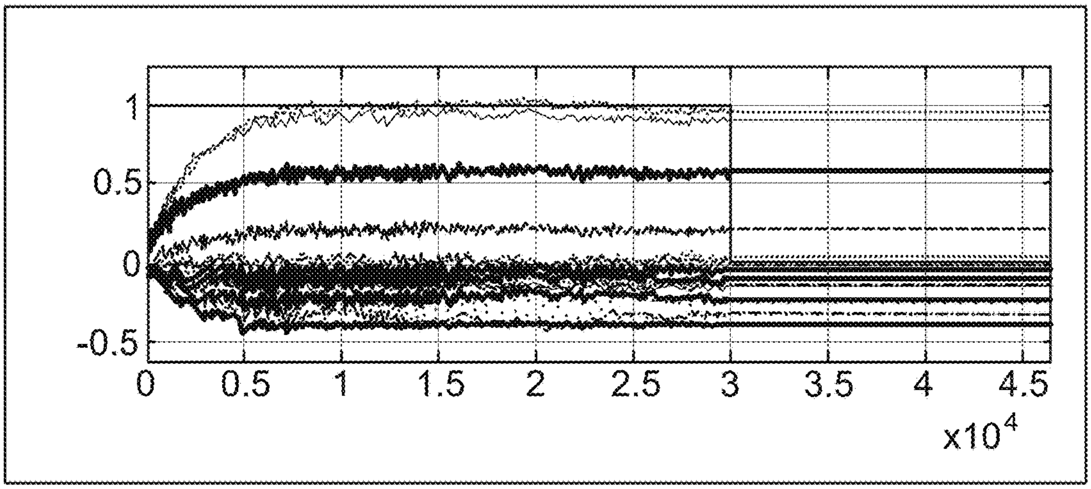
Figure 13:
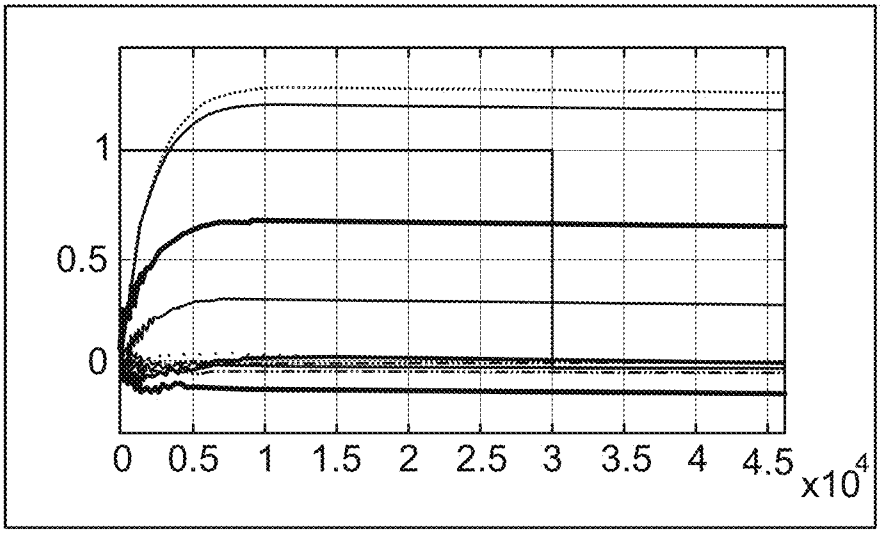
Figure 13:
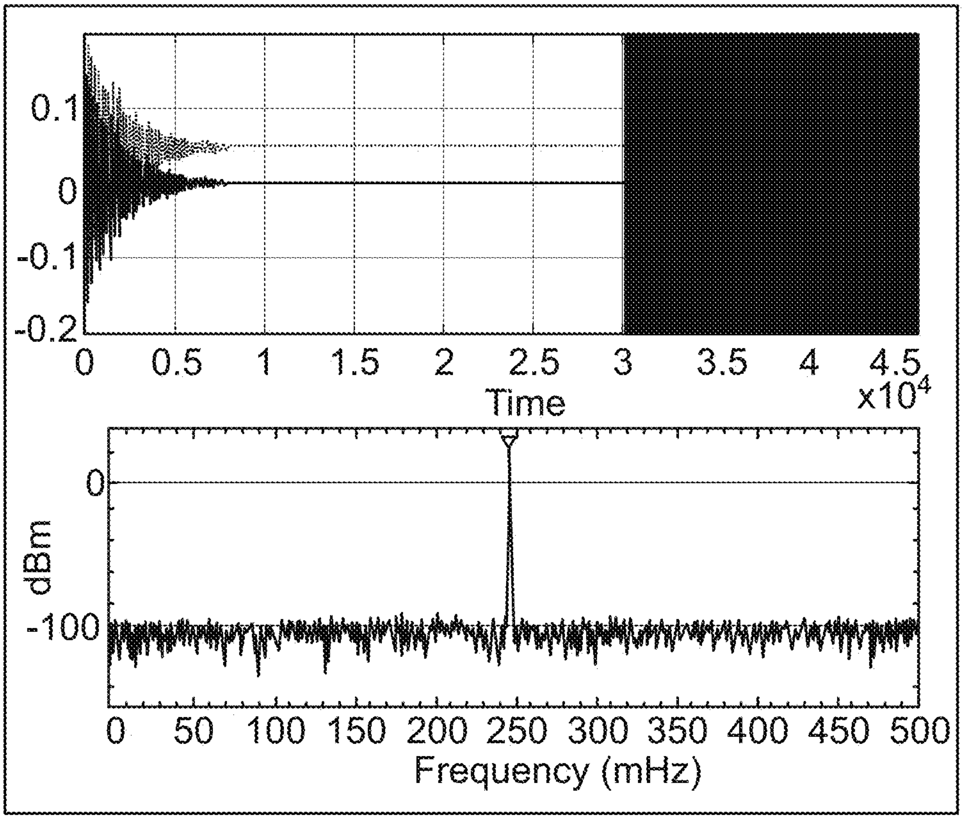
Figure 14:
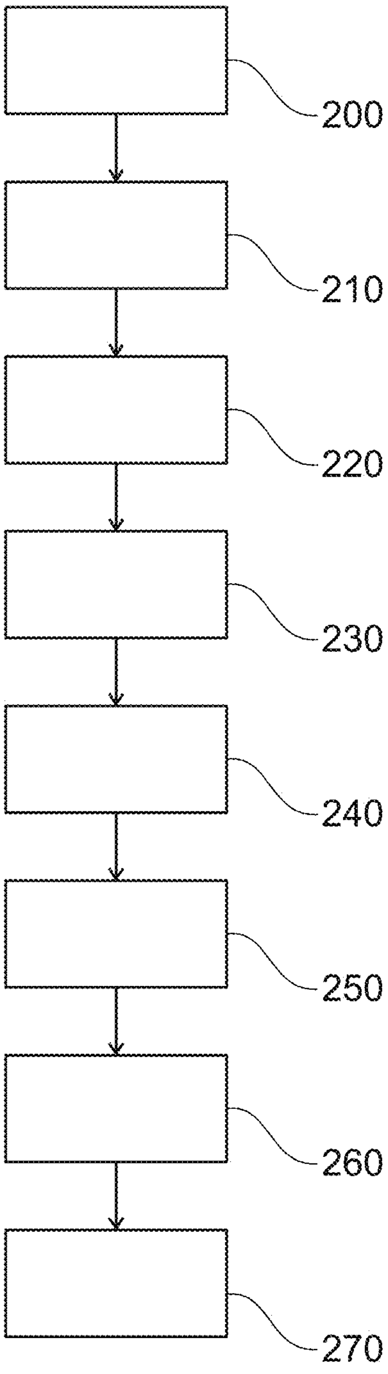

Various example embodiments may be more completely understood in consideration of the following detailed description in connection with the accompanying drawings, in which:

FIG. 1 shows a conventional CTP ADC circuit;

FIG. 2 shows the conventional CTP ADC circuit of FIG. 1 indicating a principle work mechanism of the present disclosure;

FIG. 3 shows an embodiment of a proposed CTP ADC circuit;

FIG. 4 is a diagram showing an effect of a calibration procedure;

FIG. 5 is a diagram with signals of an CTP ADC circuit in normal operation mode after having been calibrated its digital filter;

FIG. 6 is a signal diagram showing a result of a bad or no calibration of the CTP ADC circuit;

FIG. 7 is a diagram of a double stage CTP ADC circuit according to the present disclosure;

FIG. 8 is a diagram of a double stage CTP ADC circuit according to the present disclosure FIG. 9 is a diagram with signals of an CTP ADC circuit in normal operation mode after having been calibrated its digital filter;

FIG. 10 is a diagram with signals of a CTP ADC circuit in normal operation mode after having been calibrated its digital filter;

FIG. 11 is a diagram with signals of an CTP ADC circuit in normal operation mode after having been calibrated;

FIG. 12 shows signal diagrams of a proposed CTP ADC circuit without DC blocker;

FIG. 13 shows signal diagrams of a proposed CTP ADC circuit with a 3rd order IIR elliptic DC blocker; and FIG. 14 shows a flow of the proposed method.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DESCRIPTION OF EMBODIMENTS

FIG. 1 shows a block diagram of a conventional single stage continuous timeline analog-to-digital converter circuit 100. One recognizes an input 1, to which an analog input signal vin (t) can be applied. An analog delay element 10 is connected to the input 1 having a specific time delay td and is further connected to a first summation node 20. An ADC-DAC path is interconnected between the input 1 and the first summation node 20 comprising a switch S1, being switched with a specific rate fs, a sub-ADC 11 being connected to the switch S1 and the sub-DAC 12 being connected to the sub-ADC 11 and to the first summation node 20. In this way, a digitization and reconversion of the digitized analog input signal vin(t) into analog is performed and the reconverted digital is subtracted at the first summation node 20. An output of the first summation node 20 is a residue r(t), which is fed to a first analog filter 30 (continuous time filter G(s)). An output of the first analog filter 30 is sampled by means of a switch S2 with the specific rate fs and is applied to a backend ADC 41, which is connected to a second summation node 42. Furthermore, the output of the sub-ADC 11*a* is also filtered by means of a digital filter 40, whose output is connected to the second summation node 42. An output of the second summation node 42 represents a final signal v of the CTP ADC circuit 100. Marked with dotted lines is an arrangement A which represents the sampled analog path with the sub DAC 12, the first summation node 20 and the continuous-time filter 30, wherein said arrangement A has a specific discrete transfer function.

It is proposed to note that the two sub-paths are inherently subtracted at the output signal v. If a signal is injected at the input of the sub DAC 12 (with vin=0), then the output signal v=0 (ignoring quantization noise of the back-end ADC 41), if the two paths match. This observation is used to apply Least Mean Square (LMS) to the "error" v and adaptively update the digital filter 40 to match the desired response.

A principal working mechanism is shown in FIG. 2 which shows by dotted lines, that the transfer function of path C with the digital filter 40 is intended to be a replica of the transfer function of path B with the sampled analog path. If the two paths B, C are not matched, this is an indication that the output signal v is not zero and indicates that an optimized digital filter 40 is still not obtained.

FIG. 3 shows modifications of the arrangement of FIG. 2 to find the filter coefficients of the digital filter 40, in order to perform a calibration procedure according to the proposed disclosure. One recognizes a one stage CTP ADC circuit with a 2.5-bit sub ADC 11 and a back-end ADC 41 with 12-bit, wherein a sampling rate fs is 1 GHz. The continuous-time filter 30 is implemented as a second order loop filter G(s). Now it is intended to find the filter coefficients FW of the digital filter 40 as accurate and as fast as possible. This is done via a so called "foreground calibration" which means, that during calibration the normal operation mode of the CTP ADC circuit 100 is not active or stopped, respectively. That means, during normal operation the signal calib is inactive and the signal $\overline{\text{calib}}$ is active and vice versa. Once the digital filter 40 is calibrated, the CTP ADC circuit 100 returns back to normal operation mode. In the normal operation mode, the signal calib closes the corresponding switch and the signal $\overline{\text{calib}}$ opens the corresponding switch.

Initial value of the digital filter 40 (e.g. implemented aa an adaptive FIR filter) are all set to zero (can be set to nominal value also). The input 1 is disconnected and analog-delay path is connected to common-mode or zero. Gain stages 43, 44 can be implemented as a multiplier and are also bypassed in the calibration mode.

In the calibration mode the following steps are done:

The gain of the ADC1-DAC1 path is reduced to not saturate the continuous-time loop filter 30. This is done by either setting the "Gain" of analog-filter & digital-filter path to 1 or some low value.

Changes in this DC-gain can be avoided by having DAC with bit large number of levels (with reduced step-size) than ADC and extra levels are used only during calibration mode. In this case amplitude of test-signal is reduced to ensure backend ADC doesn't saturate.

A signal (e.g. pseudo random source signal, even sine or another signal) of a signal source 60 is applied as an input of the sub DAC 12. There is no strict requirements as regards the type of the signal source 60. A calibration device 50 (e.g. running an LMS algorithm) updates the filter weights FW based on the "error" of the output signal v. After the convergence of the filter weights FW, calibration can be stopped, and normal ADC conversion start (calib=0). The calibration device 50 tries to minimize the error signal err, which corresponds to the output signal v of the second summation node 42. Once the error is zero, it is known that this is the condition that the digital filter 40 is matched to the continuous-time analog filter 30. It is known in advance after how many cycles the filter coefficients have converged.

The signal delay td of the delay element 10 should be matched to the ADC-DAC path delay to minimize the residue r(t). The better the delay matching, the smaller the residue r(t), which allows to keep larger gain in the continuous-time filter 30, which relaxes the back-end ADC requirement.

FIG. 4 shows a convergence of the filter weights FW (FIR taps) with clock cycles. One recognizes, that filter weights FW converge well within 20 k cycles. Ideal filter weights for Zero Order Hold (ZOH) DAC can be expressed as follows:

$$\hat{G}(z) = c2d\left(\frac{1}{\frac{1}{(2*pi*w1)^2 s^2} + 1.4142\frac{1}{(2*pi*w1)s} + 1}\right) = \frac{0.7855z^{-1} + 0.2524z^{-2}}{1 - 0.0066z^{-1} + 0.0446z^{-2}}$$

w1 . . . filter parameter.

Based on the analog continuous-time filter 30, whose transfer function is given in the denominator of the above formula, we achieve certain FIR filter coefficients as shown in the second part of the formula.

The digital filter 40 may be an infinite impulse response filter (IIR filter), however, its impulse response dies down after few samples. For ease of implementation, the digital filter 40 can be approximated by an FIR-filter (finite impulse response filter). It is intended to implement a digital filter 40, whose response matches with the response of the continuous-time analog filter 30.

The following table shows a comparison of exemplary ideal filter weights FW vs. obtained filter weights FW after LMS-convergence:

TABLE 1

| Filter tap | Ideal coefficient | Coefficient after LMS convergence |
|---|---|---|
| 0 | 0 | 0 |
| 1 | 0.785508 | 0.785468 |
| 2 | 0.257663 | 0.257684 |
| 3 | −0.033318 | −0.033310 |
| 4 | −0.011714 | −0.011707 |
| 5 | 0.001488 | 0.001488 |

The second columns shows the expected values of the filter coefficients and the third columns shows that values are close to the expected values in the second column and have been obtained after convergence.

A value of the sampling rate fs of the output of the continuous-time filter 30 is equal to a value of the sampling rate fs of the sub DACs 11, 12. In an alternative, the value of the sampling rate fs of the output of the continuous-time filter 30 can also be smaller than a value of the sampling rate of the sub DACs 11, 12. As a result, this means that a value of the sampling rate fs of the backend ADC 41 can be same or smaller than the sampling rate of the sub DACs 11, 12.

The diagram of FIG. 4 shows filter coefficients FIR Tap 0 to FIR Tap 9, after 40 k cycles all values of the coefficients have converged within a specified tolerance. One recognizes, that after 40 k cycles the signal $\overline{\text{calib}}$ goes HIGH, which means that the calibration procedure of the CTP ADC circuit has stopped. The number of cycles is a predefined value which is known in advance. To take care of variations in process, temperature and to have an extra margin, the number of cycles may be somewhat over-dimensioned. The job of the algorithm (e.g. LMS algorithm) changes all the parameters simultaneously and tries to move all the parameters in a direction, which would converge to the right value. LMS algorithm is only exemplary, there are a lot of alternative algorithms which could be used. Requirement for LMS to converge is the provision of a pseudo random signal. It takes an amount of time to cancel the known signal and converge to the error err. The calibration device 50 takes the error signal err and the input signal sin of the signal source 60 and calculates the filter weights FW, which become the coefficients of the digital filter 40. Normalized LMS-algorithm is considered to be a very efficient algorithm in this context.

FIG. 5 shows an output spectrum of the CTP ADC circuit 100 after the coefficients of the digital filter 40 have been calibrated as having been described above and the CTP ADC circuit 100 running in the normal operation mode. The spectrum is a result of an input signal to the CTP ADC circuit 100 with appr. 250 MHz with a sampling frequency fs of 1 GHz. One recognizes, that the coefficients of the digital filter 40 are working as expected.

If the calibration is enabled, the filter weights are updated after LMS convergence, the ADC performance is restored.

FIG. 6 shows an output spectrum with the same filter coefficients, if the filter parameter w1 changes by 20%, e.g. due to RC-variation. One recognizes again the maximum of the input signal of appr. 250 MHz having been applied to the CTP ADC circuit 100, however, with much more spectral noise than in the spectrum shown in FIG. 5. In result, the CTP ADC circuit 100 is hardly functional, because in terms of ADC performance the CTP ADC circuit 100 is degraded with the spectrum shown in FIG. 6.

FIG. 7 shows a generalization of the proposed CTP ADC circuit 100 with two stages and the back end ADC 41. In order to get the final output signal v, output signals of the back end ADC 41, a first digital filter 40*a* (of the first stage) and a second digital filter 40*b* (of the second stage) are summed up via the second summation node 42, which provides the final output signal v. The calibration of both stages can be done in sequential or in parallel manner, though there is no significant difference between number of convergence cycles. The corresponding calibration signals are calib1, $\overline{\text{calib1}}$ (for the calibration of the first stage) and calib 2, $\overline{\text{calib2}}$ (for the calibration second stage), which are used as described above with respect to the single stage CTP ADC circuit 100 of FIG. 3. The order of the calibration of the stages is arbitrary.

A sequential method is described in the following. The second stage is calibrated by making the signal calib2=1. Once the filter coefficients of the second digital filter 40*b* converge, calibration is stopped. Gain of the second stage is by-passed to prevent loop saturation.

Afterwards, the first stage is calibrated by making the signals calib1=1 and calib2=0. As before, gain stage is by-passed. Once the filter coefficients of the first digital filter 40*a* converge, calibration is stopped, and normal ADC conversion of the CTP ADC circuit 100 can start.

Referring to FIG. 7 now, the calibration of the two stages of the CTP ADC circuit 100 can be performed in the following three ways:

(i) Configuration 1: Sequential
- Step 1: $calib_1$=0, $calib_2$=1 and $calib_3$=1 (finds filter coefficients of the second stage), then
- Step 2: $calib_1$=1, $calib_2$=1 and $calib_3$=0 (finds filter coefficients of the first stage),
- Step 3: $calib_1$=0, $calib_2$=0 and $calib_3$=0 normal operation, after calibration (ii) Configuration 2: Sequential
- Step1: $calib_1$=1, $calib_2$=1 and $calib_3$=0 (finds filter coefficients of the first stage), then
- Step2: $calib_1$=0, $calib_2$=1 and $calib_3$=1 (finds filter coefficients of the second stage)
- Step3: $calib_1$=0, $calib_2$=0 and $calib_3$=0 normal operation, after calibration (iii) Configuration 3: Parallel
- $calib_1$=1, $calib_2$=0 and $calib_3$=0 (finds filter coefficients of both stages simultaneously)
- $calib_1$=0, $calib_2$=0 and $calib_3$=0 after calibration
- In parallel mode, both calib2 and calib3 switches can be removed as they are always off FIG. 8 shows an arrangement of a CTP ADC circuit 100 for which a slight variant of the parallel configuration is performed. One recognizes, that in this case some switches of the second stage are not required, because they are always on or always off:

(iv) Configuration 3: Parallel modified
- $calib_1$=1 (finds filter coefficients of both stages simultaneously)
- $calib_1$=0 after calibration.

Of course, also filter coefficients of digital filters of CTP ADC circuits 100 with more than two stages (not shown) can be calibrated in the above described manner.

FIG. 9 shows a convergence of the second stage of the CTP ADC circuit 100 with FIR filter coefficients similar as shown in FIG. 4. One recognizes, that a calibration of is well done with 10 k clock cycles.

FIG. 10 shows a convergence of the first stage of the CTP ADC circuit 100 with FIR filter coefficients similar as shown in FIG. 9. One recognizes, that a calibration of is well done with 10 k clock cycles.

FIG. 11 shows a spectrum of the CTP ADC circuit after having calibrated the filter coefficients of both stages. One recognizes 90.1 dB (2-bits from the first stage, 1-bit from the second stage, 12-bits from back-end ADC 41).

In further alternative embodiments of the proposed CTP ADC circuit 100 a "DC-blocker" (not shown) may be added in a so called "error-path" functionally coupled between the second summation node 42 and the calibration device 50 to the LMS loop which may block DC (hence remove offset) from digital error data. The DC-blocker can be implemented by minimum possible stages of IIR-, CIC-, or FIR-filter. Any other possible structures can be used to filter out DC component from the digital error data.

Possible sources or offsets are e.g. the first summation nodes 20*a*, 20*b*. Any gain-mismatch after the first stage is naturally taken care as loop which will tried to be corrected as well.

To include a gain-mismatch error of the first stage, gain-bypass can be removed (calib1=0) and multi-level sub-DAC can be used with reduced amplitude of a test signal (ideally "Full-scale/Gain"). More number of sub DAC levels supports that a small test signal is still bit larger than a step-size of the sub DAC.

FIG. 12 shows three signal diagrams of the CTP ADC circuit 100 without said DC blocker.

FIG. 12*a* shows a signal at the output of the second summation node 42, FIG. 12*b* shows an ADC spectrum of a CTP ADC circuit 100 without DC blocker and FIG. 12*c* shows a DNCF (digital noise cancellation filter, i.e. a digital filter which is tuned by the LMS-algorithm), with a settling of coefficients of a CTP ADC circuit 100 without DC blocker.

FIG. 13 shows three signal diagrams of the CTP ADC circuit 100 having a DC blocker as mentioned above.

FIG. 13*a* shows a DNCF settling of coefficients of a CTP ADC circuit 100 with DC blocker, FIG. 13*b* shows input and output signals of said DC blocker and FIG. 13*c* shows an ADC spectrum of a CTP ADC circuit 100 having a DC blocker. The DC blocker is also a digital filter which will block DC components form the digital input and its output is also digital without DC value.

FIG. 14 shows a principal flow of the proposed method.

In a step 200 the continuous-time analog-to-digital converter circuit (100) is set into a calibration mode.

In a step 210 a calibration input signal is applied to an input 1.

In a step 220 the calibration input signal is delayed by means of a delay element 10 with a specified time delay td, the delay element 10 functionally connected between the input 1 and a first summation node 20.

In a step 230 the calibration input signal is digitized and the digitized signal is reconverted to analog domain and to subtract it at the first summation node 20.

In a step 240 an output of the first summation node 20 is filtered by means of a continuous-time filter 30 and clocking the output of the continuous-time filter 30 with a specified sampling rate fs.

In a step 250 the clocked output of the continuous-time filter 30 is digitized by means of a backend ADC 41 and applied to a second summation node 42.

In a step 260 an output signal v of the continuous-time analog-to-digital converter circuit 100 is provided by summing up the output of the backend ADC 41 with an output of a digital filter 40 being connected to a sub ADC being connected to the input 1.

In a step 270 a replica of a transfer function of the sampled output of the continuous-time filter 30 is provided in the digital domain by means of the digital filter 40.

The proposed CTP ADC circuit can be used for applications requiring high speed ADC. The proposed architecture also has anti-aliasing properties, which can help remove anti-aliasing filter or greatly relax its design. The proposed scheme can be implemented on-chip for foreground calibration. Signal required to feed input for DNCF estimation can be easily implemented as "digital waveform generator".

The proposed method implements a so called "foreground calibration" only which doesn't need very specific type of test-signal of the signal source 60. It can be multi-tone sine-wave, ramp-wave, chirp or even random input. As per our calibration, it's not necessary to feed digital test signal, even analog signal at the ADC input can be fed during calibration.

The proposed method is to find the DNCF in a adaptive filter manner which starts from the most inner-loop (last stage) and sequentially finding all stage filters. All the stage filters can also be tuned simultaneously using LMS/NLMS but it seem to take bit longer time than sequential estimation. Our proposal also requires bit of change in the filter-dc-gain (set to 1) during calibration.

In the foregoing description various specific details have been set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference signs may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

As examples, the specification describes and/or illustrates aspects useful for implementing the claimed disclosure by way of various circuits or circuitry which may be illustrated as or using terms such as blocks, modules, device, system, unit, controller, etc. and/or other circuit-type depictions. Such circuits or circuitry are used together with other elements to exemplify how certain embodiments may be carried out in the form or structures, steps, functions, operations, activities, etc. As examples, wherein such circuits or circuitry may correspond to logic circuitry (which may refer to or include a code-programmed/configured CPU, in one example the logic circuitry may carry out a process or method (sometimes "algorithm") by performing such activities and/or steps associated with the above-discussed functionalities. In other examples, the logic circuitry may carry out a process or method by performing these same activities/ operations.

For example, in certain of the above-discussed embodiments, one or more modules are discrete logic circuits or programmable logic circuits configured and arranged for implementing these operations/activities. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the specification may make reference to a "first" type of structure, a "second" type of structure, where the adjectives "first" and "second" are not used to connote any description of the structure or to provide any substantive meaning; rather, such adjectives are merely used for English-language antecedence to differentiate one such similarly-named structure from another similarly-named structure.

Based upon the above discussion and illustrations, those skilled in the art will readily recognize, that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps.

It should be noted that the term "comprising" does not exclude other elements or steps and "a" or "an" does not exclude a plurality. Also elements described in association with different embodiments may be combined. It should also be noted, that reference signs in the claims should not be construed as limiting the scope of the claims.

The discloses devices, apparatuses, units, elements, systems and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer readable medium, which may include storage devices and signals, in compressed or uncompressed form.

It is noted that the embodiments above have been described with reference to different subject-matters. In particular, some embodiments may have been described with reference to method-type claims whereas other embodiments may have been described with reference to apparatus-type claims.

However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

It has to be noted that embodiments have been described with reference to different subject matters. In particular, some embodiments have been described with reference to method type claims whereas other embodiments have been described with reference to apparatus type claims.

However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this application.

REFERENCE SIGNS

1 input
10, 10*a*, 10*b* delay element
11, 11*a*, 11*b* sub ADC
12, 12*a*, 12*b* sub DAC
20, 20*a*, 20*b* 1st summation node
30, 30*a*, 30*b* continuous-time filter
40, 40*a*, 40*b* digital filter
41 backend ADC
42 2nd summation node
43 DC gain stage
44 DC gain stage
50 calibration device
60 signal source
100 CTP ADC device
200 . . . 270 method steps
err error signal
FW filter weights

The invention claimed is:

1. A continuous-time analog-to-digital converter circuit, comprising:
- an input configured to receive an analog input signal;
- a delay element with a specified time delay, the delay element functionally connected between the input and a first summation node;
- an ADC-DAC path with a sub ADC and a sub DAC connected between the input and the first summation node, the ADC-DAC path configured to digitize the analog input signal and to reconvert the digitized signal to analog domain and to subtract it at the first summation node;
- wherein an output of the first summation node is filtered by means of a continuous-time filter, wherein an output of the continuous-time filter is clocked by a specified sampling rate;
- wherein a backend ADC is configured to digitize the clocked output of the analog filter and to connect the clocked output to a second summation node;
- wherein an output is obtained by a summation of the output of the backend ADC and an output of a digital filter being connected to the sub ADC, characterized in that the digital filter is configured to represent a replica of a transfer function of the sampled output of the continuous-time filter in the digital domain.

2. The continuous-time analog-to-digital converter circuit of claim 1, wherein filter coefficients of said digital filter are provided by a calibration device.

3. The continuous-time analog-to-digital converter circuit of claim 2, further comprising a signal source, configured to feed its signal to the calibration device, wherein the output is applied to the calibration device, wherein the calibration device is configured to update the filter coefficients of the digital filter.

4. The continuous-time analog-to-digital converter circuit of claim 3, wherein the signal source is configured to generate one of the following: pseudo random signal, sine wave signal.

5. The continuous-time analog-to-digital converter circuit of claim 1, wherein the digital filter is one of the following: adaptive IIR-filter, adaptive FIR filter.

6. The continuous-time analog-to-digital converter circuit of claim 1, comprising switches which are configured to set the ATP ADC circuit into a calibration mode and into normal operation mode.

7. The continuous-time analog-to-digital converter circuit of claim 6, further comprising a gain stage between the sub ADC and the digital filter and a gain stage between the first summation node and the continuous-time filter, wherein at least one of said gain stages is bypassed in the calibration mode.

8. The continuous-time analog-to-digital converter circuit of claim 6, further comprising a gain stage between the sub ADC and the digital filter or a gain stage between the first summation node and the continuous-time filter, wherein at least one of said gain stages is bypassed in the calibration mode.

9. The continuous-time analog-to-digital converter circuit of claim 1, wherein a calibration algorithm running on the calibration device is a normalized LMS algorithm.

10. The continuous-time analog-to-digital converter circuit of claim 9, wherein a number of calibration cycles of the calibration algorithm is known in advance, wherein after having performed the calibration the filter coefficients have converged within a specified tolerance.

11. The continuous-time analog-to-digital converter circuit of claim 1, further comprising a DC blocker functionally coupled between an output of the second summation node and the calibration device.

12. The continuous-time analog-to-digital converter circuit of claim 11, wherein the DC blocker is one of the following: IIR-filter, CIC-filter, FIR-filter.

13. The continuous-time analog-to-digital converter circuit of claim 1, wherein a value of the sampling rate of the output of the continuous-time filter is equal or smaller than a value of the sampling rate of the sub DACs.

14. A continuous-time analog-to-digital converter circuit, comprising:
- an input configured to receive an analog input signal;
- a delay element with a specified time delay, the delay element functionally connected between the input and a first summation node;
- a ADC-DAC path with a sub ADC and a sub DAC connected between the input and the first summation node, the ADC-DAC path configured to digitize the analog input signal and to reconvert the digitized signal to analog domain and to subtract it at the first summation node;
- wherein an output of the first summation node is filtered by means of a continuous-time filter, wherein an output of the continuous-time filter is clocked by a specified sampling rate;
- wherein a backend ADC is configured to digitize the clocked output of the analog filter and to connect the clocked output to a second summation node; wherein an output is obtained by a summation of the output of the backend ADC and an output of a digital filter being connected to the sub ADC, characterized in that the digital filter is configured to represent a replica of a transfer function of the sampled output of the continuous-time filter in the digital domain, and wherein filter coefficients of said digital filter are provided by a calibration device.

15. A method for calibrating a digital filter of a continuous-time analog-to-digital converter circuit, the method comprising:

setting the continuous-time analog-to-digital converter circuit into a calibration mode;

applying a calibration input signal at an input;

delaying the calibration input signal by means of a delay element with a specified time delay, the delay element functionally connected between the input and a first summation node;

digitizing the calibration input signal and reconverting the digitized signal to analog domain and to subtract it at the first summation node;

filtering an output of the first summation node by means of a continuous-time filter and clocking the output of the continuous-time filter with a specified sampling rate;

digitizing the clocked output of the continuous-time filter by means of a backend ADC and applying it to a second summation node;

providing an output signal of the continuous-time analog-to-digital converter circuit by summing up the output of the backend ADC with an output of a digital filter being connected to a sub ADC being connected to the input; and providing a replica of a transfer function of the sampled output of the continuous-time filter in the digital domain by means of the digital filter.

16. The method of claim 15, wherein by means of the calibration device an RMS error of the output signal is minimized.

17. The method of claim 15, wherein a number of cycles of a calibration procedure is performed, wherein the number of cycles cause the coefficients of the digital filter to converge within a specified tolerance band.

* * * * *